United States Patent [19]

Eden et al.

[11] Patent Number: 4,649,059
[45] Date of Patent: Mar. 10, 1987

[54] PHOTOIONIZATION TECHNIQUE FOR GROWTH OF METALLIC FILMS

[75] Inventors: James G. Eden, Champaign; David B. Geohegan, Urbana, both of Ill.

[73] Assignee: The United States of America as represented by the Secretary of the Air Force, Washington, D.C.

[21] Appl. No.: 738,817

[22] Filed: May 29, 1985

[51] Int. Cl.$^4$ .................................................. B05D 3/06
[52] U.S. Cl. ..................................... 427/38; 427/53.1; 427/54.1; 427/86; 118/50.1; 118/723
[58] Field of Search ...................... 118/723, 724, 50.1; 427/38, 53.1, 54.1, 86

[56] References Cited

U.S. PATENT DOCUMENTS

| | | | |
|---|---|---|---|
| 4,260,649 | 4/1981 | Dension et al. | 427/53.1 |
| 4,324,854 | 4/1982 | Beauchamp et al. | 430/296 |
| 4,335,160 | 6/1982 | Neary et al. | 427/38 |
| 4,340,617 | 7/1982 | Deutsch et al. | 427/53.1 |
| 4,359,485 | 11/1982 | Donnelly et al. | 427/53.1 |
| 4,412,899 | 11/1983 | Beale | 204/192 R |

Primary Examiner—John H. Newsome
Attorney, Agent, or Firm—Bobby D. Scearce; Donald J. Singer

[57] ABSTRACT

A novel method and system for depositing films of selected metallic or semiconductor materials, and particularly of the group III, IV, and V elements, is described which comprises heating a halide compound of the material to produce vapor within a substantially closed chamber, irradiating the vapor with light of preselected wavelength to dissociatively photoionize the vapor into the constituent positive ions of the material and negative halogen ions, and subjecting the photoionized vapor to an electric field to selectively remove the positive ions of the material for plating as a film.

15 Claims, 2 Drawing Figures

PHOTOIONIZATION TECHNIQUE FOR GROWTH OF METALLIC FILMS

RIGHTS OF THE GOVERNMENT

The invention described herein may be manufactured and used by or for the Government of the United States for all governmental purposes without the payment of any royalty.

BACKGROUND OF THE INVENTION

This invention relates generally to methods for ion vapor deposition of thin metallic films, and more particularly to a novel method for depositing films of selected metals or semiconductor materials by dissociatively photoionizing the corresponding halide compound in an electric field.

Techniques in general use for depositing metallic or semiconductor films from the vapor phase comprise production of ions for deposition from the vapor of the specific element to be deposited. Consequently, the extremely high temperature required to vaporize a metallic or semiconductor material for deposition produce contaminant ions by chemical reaction with the equipment housing or by outgassing of the reactor wall, and a mass selection step in the deposition process may be required to remove the contaminant ions.

The present invention provides a novel method for vapor depositing metal or semiconductor films, particularly of group III, IV and V metals and semiconductor materials. It has been previously demonstrated (A. Terenin et al, *Phys Z Sowjetunion,* 2, 299 (1932)) that atomic metal-halogen ion pairs may be produced by irradiating the vapor of polar metal halide diatomic molecules in a narrow region of the ultraviolet near 200 nanometers (nm). According to the present invention, a metal halide compound is vaporized in a photoionization cell and subjected to a uniform electric field of predetermined field strength. The halide vapor is irradiated by light of preselected wavelength to dissociatively photoionize the vaporous halide molecules; the (positive) metallic ions so produced are deposited as a film on a substrate comprising the cathode of the field-producing electrostatic lens. The deposition method of the invention utilizes the large ultraviolet photoionization cross sections characteristic of certain halide molecules to produce large and easily controlled densities of positive ions for plating. The invention is a substantial improvement over existing deposition methods: First, the use of the metal halide as the donor molecule ensures that the dissociative photoionization process produces only one positive ion (the metallic ion) which minimizes the incorporation of foreign species into the resulting film and eliminates any need for a mass selection step in the process. Second, since the metal halide compound generally has a much higher photoionization cross section than that of the metal, and since the halide compound is considerably more volatile than the metal, large numbers of the metallic ions may be produced at a moderate irradiation intensity, the deposition can be performed at much lower temperatures than with conventional methods, and the substrate can be conveniently separated from the ion production region in the deposition chamber. Third, since the process of the invention produces charged ions of the metal to be deposited, selective area disposition is readily attainable by electrostatic control, and, consequently, writing on a substrate is achievable which may be useful in producing crystalline or compound semiconductor films or in growing and doping materials, such as indium phosphide, which decompose at relatively low temperatures.

It is, therefore, a principal object of the invention to provide an improved method for the deposition of metal or semiconductor films.

It is a further object to provide a low temperature process for the deposition of thin films of selected metals and semiconductor materials.

These and other objects of the present invention will become apparent as the detailed description of certain representative embodiments thereof proceeds.

SUMMARY OF THE INVENTION

In accordance with the foregoing principles and objects of the present invention, a novel method and system for depositing films of selected metallic or semiconductor materials, and particularly of the group III, IV, and V elements, is described which comprises heating a halide compound of the material to produce vapor within a substantially closed chamber, irradiating the vapor with light of preselected wavelength to dissociatively photoionize the vapor into the constituent positive ions of the material and negative halogen ions, and subjecting the photoionized vapor to an electric field to selectively remove the positive ions of the material for plating as a film.

DESCRIPTION OF THE DRAWINGS

The present invention will be more clearly understood from the following detailed description of representative embodiments thereof read in conjunction with the accompanying drawings wherein.

DETAILED DESCRIPTION

Figure 1:
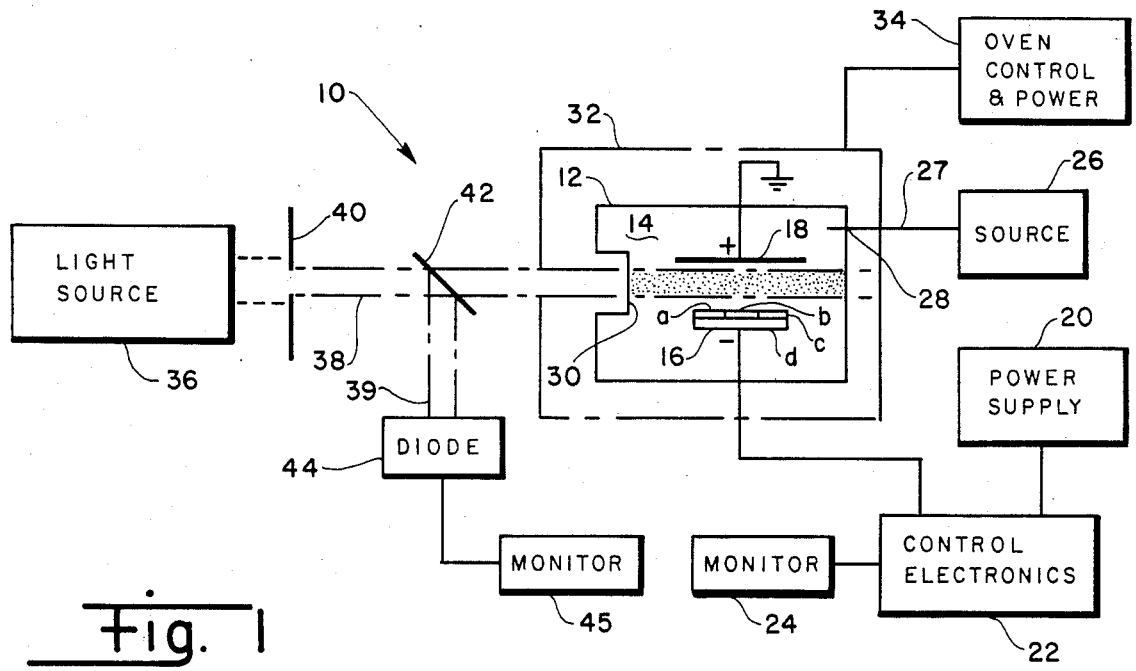
FIG. 1 is a schematic of the photoionization cell, light source, oven, and associated electronic equipment comprising the invention and useful in the practice of the method thereof.

Referring now to the drawings. FIG. 1 is a diagram of a representative system 10 of the invention, including process equipment and associated electronics. System 10 comprises a substantially closed photoionization cell 12 defining an interior volume 14 wherein the photoionization process and metal deposition according to the method of the invention is performed. Parallel confronting electrostatic plates 16,18 mounted within volume 14 provide an electric field for separating the positively charged metallic ions from the negatively charged nonmetallic ions produced by the dissociative photoionization process. Accordingly, plate 16 comprises the negative (−) plate and plate 18 comprises the positive (+) plate. Plate 16 (the cathode), to which the metallic ions are attracted for plating, may comprise stainless steel, nickel, copper, silver or other appropriate (conducting) substrate material preselected according to the material desired to be plated. Power and control electronics including bias power supply 20, control electronics 22, and monitor 24 (an oscilloscope or the like) operatively connected to plates 16,18 provide means to maintain an electric field of preselected field strength between plates 16,18 and to monitor the number of ions collected at the cathode (plate 16). Source 26 of a halogen compound (halide) of the metal provides material (by distillation or the like) to cell 12 through supply line 27 and port 28. Entrance window 30 (of quartz or similar material capable of transmitting radiation of wavelength λ of about 200 nm) is included at one end of cell 12 for admitting a light beam as hereinafter described. Cell 12 is housed in oven 32 for heating the metal halide within cell 12 to vapor at predetermined temperature. Power supply control electronics 34 operatively connected to oven 32 provide temperature control.

Source 36 of an intense light beam 38 of wavelength preselected according to the species of metal halide compound vapor to be photoionized within cell 12 is operatively disposed adjacent cell 12 as suggested in FIG. 1. Light source 36 may comprise a laser, xenon lamp, deuterium lamp, or other source of intense radiation emitting at a wavelength near 200 nm but matched (as closely as practical) to the peak in the dissociative ionization spectrum of the metal-halide molecule of interest. A tunable source 36 may therefore be desired. Slit 40 is disposed adjacent source 36 to spatially filter beam 38 to dimensions corresponding substantially to the spacing between plates 16,18. Beamsplitter 42 is disposed between slit 30 and cell 12 to deflect a small fraction 39 of beam 38 onto vacuum photodiode 44, whereby the long term stability of source 30 may be monitored. The output signal of photodiode 44 may be displayed by monitor 45 comprising an oscilloscope.

In the practice of the invention, a metal halide molecule is dissociatively photoionized in the vapor phase by irradiation with beam 38. The resulting ions produced from the vapor are subjected to an electric field generated between plates 16,18.

Representative of the systems which may be photoionized according to the present invention is the indium monoiodide system. Positive indium ions may be produced in one of the two ways. The first involves the absorption of a single ultraviolet photon which dissociatively photoionizes the molecule:

$$\text{In I} + h\nu(\geq 6.24 \text{ eV}) \rightarrow \text{In}^+ + I^- \quad (1)$$

which, as noted in Equation (1), requires a minimum photon energy of 6.24 eV. The production of metal ions by directly photoionizing the molecule,

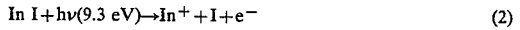

$$\text{In I} + h\nu(9.3 \text{ eV}) \rightarrow \text{In}^+ + I + e^- \quad (2)$$

requires a much higher energy photon. The large electronegativity of the iodine atom (3.06 eV) accounts for the difference in the threshold photon energies of Equations (1) and (2). Consequently, there are two advantages to using a system governed by Equation (1) for generating metal ions for the growth or doping of metal films:

a. The large electronegativities of the halogen atoms allow use of a longer wavelength radiation source while still producing the desired metal ion. For InI, for example, the process described by Equation (2) requires a photon energy of 9.3 eV which lies in a region of the spectrum where no efficient lasers currently exist, whereas, the photon energy for ion pair production according to Equation (1) is 6.24 eV which corresponds well with the energy of an ArF excimer laser photon. This laser is quite efficient (1-3% "wallplug") and is available commercially.

b. The extraneous product of both Equations (1) and (2) is the iodine atom. It is advantageous, however, for this atom to be negatively charged since it will be repelled by plate 16 (cathode) to which the metal ions will be attracted. This prevents iodine from wandering to the substrate and being incorporated into the growing film. If the laser flux is large enough, tremendous numbers of ions can be produced in a single laser pulse and can be controllably extracted from the plasma using an electrostatic lens (plates 16,18). For system 10, metallic ions generated in the plasma are collected at plate 16 and the ion current pulse is displayed on monitor 24. The total charge collected by plate 16 is determined by integrating the ion current waveform.

The method of the present invention is superior to techniques existing in the prior art in that use of the metal halide allows the film growth process to be performed at a much lower temperature than that required by conventional techniques. Atomic indium, for example, has a one-Torr vapor pressure temperature greater than 800° C., whereas for the monoiodide this temperature is about 390° C. For other systems herein mentioned, the halide compound of the element (metal or semiconductor material) of interest has similarly low vapor pressure compared to that of the element. Further, each halide compound (and particularly the iodide) generally has a much higher photoionization cross section than that of the corresponding constituent element; for example, the photoionization cross section for indium iodide at 193 nm was measured to be greater than about $10^{-17}$ cm$^2$ (Geohegan, McCowan and Eden, J Chem Phys 81, 12:5336 (Dec. 15, 1984)), which allows copious quantities of ions to be produced with moderate laser intensities, thus reducing the time required to obtain a film of given thickness. The photoionization cross sections for the group III metal halides (such as InI and TlI) are large because the ions produced according to the process corresponding to Equation (1) are augmented by the two step process:

$$\text{InI} + h\nu \rightarrow \text{In}^* + I \rightarrow \text{In} + I \quad (3)$$

and

$$\text{In} + h\nu \rightarrow \text{In}^+ + e^- \quad (4)$$

One potential drawback of a process according to Equation (1) is that radiation is required in a relatively narrow spectral range but, as mentioned earlier, it is fortunate that, for many of the metal halides of interest (the iodides of the group III metals for example) this region overlaps the wavelength of the ArF excimer laser (193 nm).

Systems contemplated herein which may be photoionized for plating out of the metallic constituent according to the present invention include the halides (i.e., fluoride, chloride, bromide or iodide) of indium, thallium, aluminum, gallium, germanium, silicon, silver, tin, bismuth, antimony, phosphorus, arsenic, zinc, cadmium, gold, nickel, iron, and other group IB, III, IV and V elements, although other systems might be used as would occur to one with skill in the field of the invention guided by these teachings and within the scope of the appended claims. The iodides of the above metals are preferred since they generally have the highest vapor pressures (at a given temperature) and have the weakest bond strengths.

Appropriate beam 38 wavelength and vapor (oven 32) temperature ranges for selected example systems are given in Table I. Beam 38 power and electric field strength may vary according to selected halide system, overall size of the components of system 10, and desired deposition rate. Beam 38 wavelength may range from about 150 to about 250 nm, depending on the selected system. Typical vapor pressures may be about $10^{-3}$ to about 5 Torr, consistent with allowing sufficient vapor to be irradiated to generate sufficient ions for plating.

TABLE I

Parameters for Photoionizing Selected Halide Systems

| Halide System | Vapor Temp °C. | Wavelength (nm) |
|---|---|---|
| Thallium Chloride | 300–450 | 193 |
| Thallium Iodide (TlI) | 350–450 | 210, 193 |
| Thallium Bromide (TlBr) | 300–450 | 193 |
| Indium Monoiodide (InI) | 160–400 | 193 |
| Indium Triiodide (InI$_3$) | 130–300 | 193 |
| Aluminum Triiodide (AlI$_3$) | 100–200 | 193 |
| Silver Iodide | 700–800 | 193 |

In a system built in demonstration of the invention, cell 12 comprised a Pyrex ™ envelope approximately 18.8 centimeters long and 4.8 centimeters in diameter. Entrance window 30 comprised Suprasil ™ quartz and was recessed 8.9 centimeters to localize optical power deposition in the vapor between plates 16,18. The spacing between plates 16,18 was about 10 mm. Source 36 comprised a high peak power argon fluoride (ArF) excimer laser (193 nm) (Lambda Physik EMG 102) when depositing indium from indium monoiodide, or a 150 watt xenon arc lamp when depositing thallium from thallium iodide. For the selected cell 12 size and spacing between plates 16,18 in the demonstration system, beam 38 dimensions were confined by slit 40 to about 2.6×0.4 centimeters to ensure that substantially all the vapor region between plates 16,18 was irradiated without irradiating either individual plate. The ArF laser was typically operated at a repetition frequency of about 30 Hz, and the xenon arc lamp was driven by a regulated dc power supply. Approximately 50–500 volts of bias was applied across plates 16,18, corresponding to a field strength therebetween of about 50–500 volts/cm. Prior to deposition, cell 12 was outgassed by heating (about 350° C.) under vacuum (of less than $10^{-6}$ Torr).

For the example indium depositions using the ArF excimer laser, about 1 to 10 milligrams of indium iodide (99.999%, Pfaltz and Bauer) were loaded into a Pyrex ™ sidearm (source 26) and distilled into cell 12. The cell was heated to an optimum temperature of between 300° and 350° C. and the InI vapor was photoionized by the excimer laser. Measurement of the current flowing through external biasing circuitry 22 revealed that more than $10^{12}$ ions per laser pulse were collected at indium iodide concentrations of about $8 \times 10^{14}$ cm$^{-3}$ and laser pulse energies of about 50 mJ. With this arrangement, indium films of about 0.2 micron thickness were deposited on a nickel substrate comprising plate 16. Typical film thickness attainable using the process of the invention ranged from about 100 angstroms to about 1 micron.

In order to facilitate the analysis of the deposited films, the cathode (plate 16) comprised three one-centimeter square stainless steel plate sections 16a,b,c; nickel was electroplated onto the stainless steel and the sections were mounted in abutting relationship on a larger stainless steel holder 16d as suggested in FIG. 1. The anode (plate 18) comprised a 2.5×7.5×0.3 centimeter plate of electropolished stainless steel.

For the example thallium depositions, about 1 to 10 milligrams of thallium iodide (99.995%, Alfa-Ventron) were distilled into cell 12 and the vapor was irradiated with the high pressure xenon lamp and subjected to a field strength of about 100 volts/cm, to produce films about 0.2 micron thick; the inefficient production of thallium ions (about 2% Tl$^+$,I$^-$ ion pair yield for TlI at 193 nm) by an ArF laser dictated that, for the growth of thallium films, a source be chosen having a wavelength closer to the wavelength for peak ion production efficiency (about 210 nm) (e.g., the first Stokes line of the ArF laser Raman shifted in H$_2$ or, for simplicity, the xenon arc lamp). For the thallium depositions, plate sections 16a,b,c had an additional thin (about one micron) layer of silver (99.99%) evaporated onto the nickel.

Example aluminum films of about 100 to 1000 angstroms in thickness were deposited using the ArF excimer laser, in manner similar to that described for the indium depositions. About 10 milligrams of aluminum iodide (AlI$_3$) were vaporized to about 0.1 to 1 Torr at 140°–180° C. and photoionized by the excimer laser at 193 nm to produce the films. Based on similarities in the chemical structure of the metal halides, films of silver, gallium, tin, germanium (from GeI$_2$), silicon, arsenic, antimony and bismuth may also be deposited in this manner.

The films deposited in demonstration of the invention had a small growth rate (about 420 angstroms per hour) due primarily to the small metal halide densities involved, although improvement in deposition rate of at least an order of magnitude may be realized by improving the coupling of the radiation with the vapor and by increasing the source intensity and halide vapor pressure.

Figure 2:
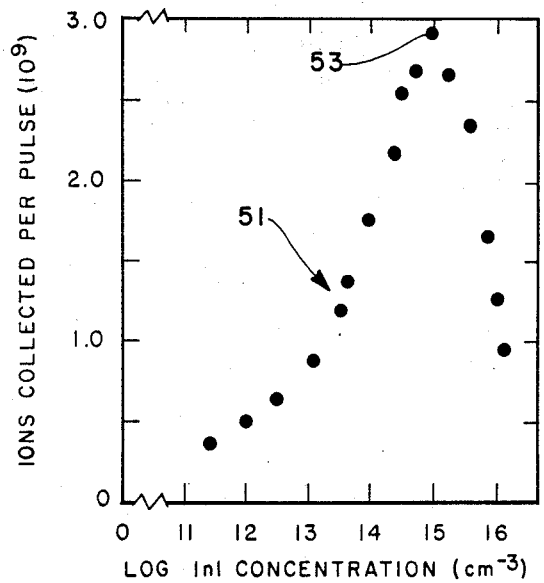
FIG. 2 is a plot of indium collection efficiency versus vaporous indium iodide concentration when the radiation from an ArF excimer laser at $\lambda = 193$ nm photoionizes the vapor.

FIG. 2 shows the dependence (plot 51) of the number of In$^+$ ions collected per pulse versus InI ground state concentration for a laser intensity of about 4.7 MW cm$^{-2}$. Since the absorption cross section for indium iodide at 193 nm is about $4 \times 10^{-16}$ cm$^2$, the optical absorption length of the vapor (for an InI number density of $10^{15}$ cm$^{-3}$) is 2 to 3 centimeters which is approximately one-half the length of the vapor column. Note from FIG. 2 that the In$^+$ collection efficiency peaks at an InI number density near $10^{15}$ cm$^{-3}$ where the illumination of the vapor is substantially uniform within cell 12 for the length of plates 16,18 comprising system 10 of the demonstration system. At peak 53 of plot 51, approximately $5 \times 10^{14}$ ions are actually produced and so the peak collection efficiency is about $10^{-3}$%. For an indium iodide vapor concentration of about $10^{16}$ cm$^{-3}$, however, the beam will be almost completely attenuated in less than one centimeter, thereby explaining the rapid drop in collection efficiency at higher vapor pressures since the ions created in the region immediately adjacent entrance window 30 are not efficiently collected.

An Auger spectrum for an indium film (about 0.2 micron) deposited on nickel was recorded at about 200 angstroms below the film surface which corresponds to about two minutes of sputtering with an Ar$^+$ ion beam. Both indium and nickel were prominent but no iodine was detected. Secondary ion mass spectrometry analysis revealed only trace amounts of iodine in all of the films grown. Similarly, a secondary ion mass spectrometry depth profile for a thallium film (0.2 micron thick) deposited on the silver plated substrate at a xenon lamp intensity of about 0.5 watts/cm$^2$ showed only trace concentrations of iodine. These results confirm that the films are grown by dissociation of the parent metal halide and transport of the positive (metallic) ion to the substrate by the imposed electric field, and not by gas phase migration of the parent metal halide to the substrate surface followed by decomposition there of the molecule.

The present invention, as hereinabove described, therefore provides a novel system and method for producing thin films of selected metals and semiconductor materials by dissociatively photoionizing the corresponding halide compound in an electric field. It is understood that certain modifications to the invention as described may be made, as might occur to one with skill in the field of this invention, within the scope of the appended claims. Therefore, all embodiments contemplated hereunder which achieve the objectives of the invention have not been shown in complete detail. Other embodiments may be developed without departing from the spirit of the invention or from the scope of the appended claims.

We claim:

1. A method for producing a thin film of a material, comprising the steps of:
   a. providing a halogen compound of said material;
   b. heating said halogen compound within a substantially closed chamber to produce a vapor of said halogen compound;
   c. irradiating said halogen compound vapor with light of preselected wavelength to dissociatively photoionize said vapor into the constituent positive ions of said material and negative halogen ions; and
   d. generating an electric field within said irradiated vapor to selectively remove said positive ions of said material from said vapor for plating as said film of said material.

2. The method as recited in claim 1 wherein said electric field is generated as a substantially uniform electric field within said vapor irradiated by said light.

3. The method as recited in claim 2 including a cathode and an anode between which said substantially uniform electric field is generated, said cathode comprising a substrate for supporting said plated film.

4. The method as recited in claim 1 wherein said material is selected from the group consisting of indium, thallium, aluminum, gallium, silver, tin, germanium, silicon, bismuth, antimony, phosphorus, arsenic, zinc, cadmium, gold, nickel, and iron.

5. The method as recited in claim 1 wherein said halogen compound is an iodide of said material.

6. The method as recited in claim 1 wherein said light has a preselected wavelength in the range of from about 150 to about 250 nanometers.

7. A system for producing a thin film of a material, comprising:
   a. a substantially closed chamber;
   b. a supply of a halogen compound of said material within said chamber;
   c. means for heating said halogen compound to produce a vapor of said halogen compound within said chamber;
   d. a source of light of preselected wavelength for irradiating said vapor to dissociatively photoionize said vapor into the constituent positive ions of said material and negative halogen ions; and
   e. means for generating an electric field within said vapor irradiated by light from said source to selectively remove said positive ions of said material from said vapor for plating as said film of said material.

8. The system as recited in claim 7 wherein said electric field is a substantially uniform electric field within said vapor irradiated by said light.

9. The system as recited in claim 7 wherein said means for generating an electric field includes a cathode and anode, said cathode comprising a substrate for supporting said plated film.

10. The system as recited in claim 7 wherein said material comprises an element selected from the group consisting of indium, thallium, aluminum, gallium, silver, tin, germanium, silicon, bismuth, antimony, phosphorus, arsenic, zinc, cadmium, gold, nickel, and iron.

11. The system as recited in claim 7 wherein said halogen compound is an iodide of said material.

12. The system as recited in claim 7 wherein said source of light is a laser.

13. The system as recited in claim 7 wherein said source of light is a xenon arc lamp.

14. The system as recited in claim 7 wherein said source of light is a deuterium lamp.

15. The system as recited in claim 7 wherein said light has a preselected wavelength in the range of from about 150 to about 250 nanometers.

* * * * *